United States Patent
Redgrave

(10) Patent No.: US 7,272,031 B1
(45) Date of Patent: Sep. 18, 2007

(54) METHOD AND APPARATUS FOR REDUCED POWER CELL

(75) Inventor: Jason Redgrave, Mountain View, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

(21) Appl. No.: 11/081,874

(22) Filed: Mar. 15, 2005

(51) Int. Cl.
*G11C 11/00* (2006.01)

(52) U.S. Cl. .................. 365/156; 365/154; 365/227

(58) Field of Classification Search ............... 365/154
See application file for complete search history.

(56) References Cited

U.S. PATENT DOCUMENTS

| | | | |
|---|---|---|---|
| 5,245,575 A | 9/1993 | Sasaki et al. | |
| 5,369,622 A | 11/1994 | McLaury | |
| 5,532,958 A | 7/1996 | Jiang et al. | |
| 5,581,500 A * | 12/1996 | D'Souza | 365/156 |
| 5,734,622 A * | 3/1998 | Furumochi et al. | 365/233.5 |
| 5,768,178 A | 6/1998 | McLaury | |
| 5,991,191 A * | 11/1999 | Rao | 365/154 |
| 6,111,779 A * | 8/2000 | You | 365/154 |
| 6,134,154 A | 10/2000 | Iwaki et al. | |
| 6,173,379 B1 | 1/2001 | Poplingher et al. | |
| 6,205,076 B1 | 3/2001 | Wakayama | |
| 6,326,651 B1 | 12/2001 | Manabe | |
| 6,560,139 B2 * | 5/2003 | Ma et al. | 365/154 |
| 6,643,173 B2 * | 11/2003 | Takemura | 365/185.05 |
| 6,724,648 B2 * | 4/2004 | Khellah et al. | 365/154 |
| 6,809,979 B1 | 10/2004 | Tang | |
| 6,903,962 B2 * | 6/2005 | Nii | 365/156 |
| 6,925,025 B2 * | 8/2005 | Deng et al. | 365/226 |
| 6,937,535 B2 | 8/2005 | Ahn et al. | |

(Continued)

OTHER PUBLICATIONS

U.S. Appl. No. 11/081,870, filed Mar. 15, 2005, Redgrave.
U.S. Appl. No. 11/081,870 (non-final office action), filed Mar. 15, 2005, Redgrave.

(Continued)

*Primary Examiner*—Son L. Mai
(74) *Attorney, Agent, or Firm*—Adeli Law Group PLC

(57) ABSTRACT

The invention relates to reduced power cells. Some embodiments of the invention provide a memory circuit that has a storage cell. The storage cell contains several electronic components and an input. The electronic components receive a reduced voltage from the input to the cell. The reduced voltage reduces the current leakage of the electronic components within the cell. Some embodiments provide a memory circuit that has a level converter. The level converter receives a reduced voltage and converts the reduced voltage into values that can be used to store and retrieve data with stability in the cell. Some embodiments provide a method for storing data in a memory circuit that has a storage cell. The method applies a reduced voltage to the input of the cell. The method level converts the reduced voltage. The reduced voltage is converted to a value that can be used to store and retrieve data with stability in the cell. The reduced voltage reduces a current leakage of electronic components within the cell.

18 Claims, 3 Drawing Sheets

Reduced Power Cell

U.S. PATENT DOCUMENTS

| | | | | |
|---|---|---|---|---|
| 6,970,374 | B2 * | 11/2005 | Lin | 365/154 |
| 7,027,346 | B2 * | 4/2006 | Houston et al. | 365/229 |
| 7,110,317 | B2 * | 9/2006 | Song et al. | 365/226 |
| 2001/0038552 | A1 * | 11/2001 | Ishimaru | 365/181 |
| 2004/0233758 | A1 | 11/2004 | Kim et al. | |
| 2005/0128789 | A1 * | 6/2005 | Houston | 365/154 |
| 2005/0254315 | A1 * | 11/2005 | Salters | 365/189.11 |

OTHER PUBLICATIONS

"Design for Low Power in Actel Antifuse FPGAs", Actel Application Note, 2000 Actel Corporation, Sep. 2000, pp. 1-8.

Gayasen, A., et al., "Reducing Leakage Energy in FPGAs Using region-Constrained Placement," *FPGA '04,* Feb. 22-24, 2004, pp. 51-58, ACM, Monterey, California, USA.

* cited by examiner

Gate Leakage

Sub-threshold Leakage
V(g-s)=0

Reduced Power Cell

METHOD AND APPARATUS FOR REDUCED POWER CELL

CROSS REFERENCE TO RELATED APPLICATION

This application is related to U.S. patent application Ser. No. 11/081,870, filed Mar. 15, 2005.

FIELD OF THE INVENTION

The present invention relates to reduced power cells.

BACKGROUND OF THE INVENTION

Volatile memory circuits are quite common today. Such memory circuits can be contained in an individual integrated circuit (IC) chip or can be part of other IC's. These IC's include a configurable IC that uses a memory circuit to store configuration data. The configurable IC can be configured to perform a set of operations based on the stored configuration data.

The use of configurable IC's has dramatically increased in recent years. One example of a configurable IC is a field programmable gate array (FPGA). An FPGA is a field programmable IC that has an internal array of logic circuits (also called logic blocks) that are connected together through numerous interconnect circuits (also called interconnects) and that are surrounded by input/output blocks. Like some other configurable IC's, the logic circuits and the interconnect circuits of an FPGA are configurable. In other words, each of these circuits receives configuration data that configures the circuit to perform an operation in a set of operations that it can perform. One benefit of configurable IC's is that they can be uniformly mass produced and then subsequently configured to perform different operations.

As mentioned above, configurable IC's typically store their configuration data in memory cells. FIG. 1 illustrates a memory circuit 100 of a configurable IC. As shown in this figure, the memory circuit 100 includes: (1) a storage cell 128 for storing a configuration data value; (2) a VDDcell line 106 for supplying power to the storage cell 128; (3) true and complement bit lines 110 and 115 for reading and/or writing the contents of the storage cell 128; (4) pass gates 120 and 125 for connecting the bit lines 110 and 115 to the storage cell 128; and (5) output lines 160 and 165 for outputting, through configuration buffers 140 and 145, the contents of the storage cell 128 without the need for a read operation.

The typical storage cell 128 in the art requires that the voltage within the cell 128 and through the buffers 140 and 145 be driven to the rails in order for the cell 128 to retain stable values and output a useable configuration value (i.e., VDDcell 106 is typically VDD). If the voltage within the storage cell 128 is less than the voltage on a word line used to read the cell, then a read operation could cause instability in the value stored by the storage cell 128 by undesirably altering the value stored in the storage cell 128. This condition is also known as "read upset."

However, requiring the voltage within the cell 128 and through the buffers 140 and 145 to be driven to the rails exasperates current leakage from the cell, since current leakage from the memory cell is non linearly (e.g., exponentially) proportional to the voltages that are used to store data in the memory cell. Specifically, in the memory cell 100 there are two kinds of leakage that are problematic: sub threshold leakage and gate leakage.

FIG. 2 illustrates an example of sub threshold leakage through an NMOS transistor 200 that is commonly used in memory circuits. In FIG. 2, the gate and source leads of the NMOS transistor 200 are short circuited to represent that their voltage difference is zero (i.e., Vg-s=0). Even though the transistor is "off" in this sub threshold condition, there is still undesirable leakage current through the transistor 200, as shown in FIG. 2.

FIG. 3 illustrates an example of gate leakage through an NMOS transistor 305. Electron tunneling through the gate oxide of a transistor causes gate leakage current. For a 90 nm electronic component (e.g., a transistor), gate oxide can be about fourteen angstroms or approximately seven silicon dioxide atoms thick. This distance is sufficiently short to allow tunneling current to flow through the gate oxide even at voltage levels as low as one volt. Gate leakage in N-channel devices is significantly worse than in P-channel devices.

With the size of electronic components continually becoming smaller due to improvements in semiconductor technology, leakage current is a continually growing problem. Leakage current in a standard (six transistor) memory cell is exponentially proportionate to voltage. So if the voltage in the cell can be reduced, then the amount of leakage (i.e., both gate and sub threshold leakage) in the cell can be exponentially reduced. However, a typical memory cell has particular voltage requirements in order for the cell to function properly. Thus, if the voltage within the cell is reduced too much, then the cell becomes unstable and unable to store and output data reliably, as seen in the case of the read upset condition. Thus, there is a need in the art for a useable reduced power configuration storage cell, such that the leakage from electronic components within the cell is reduced, while retaining useable output configuration signals.

SUMMARY OF THE INVENTION

The invention relates to reduced power cells. Some embodiments of the invention provide a memory circuit that has a storage cell. The storage cell contains several electronic components and an input. The electronic components receive a reduced voltage from the input to the cell. The reduced voltage reduces the current leakage of the electronic components within the cell. Some embodiments provide a memory circuit that has a level converter. The level converter receives a reduced voltage and converts the reduced voltage into values that can be used to store and retrieve data with stability in the cell. Some embodiments provide a method for storing data in a memory circuit that has a storage cell. The method applies a reduced voltage to the input of the cell. The method level converts the reduced voltage. The reduced voltage is converted to a value that can be used to store and retrieve data with stability in the cell. The reduced voltage reduces a current leakage of electronic components within the cell.

BRIEF DESCRIPTION OF THE DRAWINGS

The objects, features, and advantages of the invention will be apparent to one skilled in the art, in view of the following detailed description in which.

DETAILED DESCRIPTION OF THE INVENTION

The invention is directed towards reduced power static random access memory (SRAM) cells. In the following description, numerous details are set forth for purpose of explanation. However, one of ordinary skill in the art will realize that the invention may be practiced without the use of these specific details. For instance, the invention has primarily been described with reference to the storage cells for volatile memory (e.g., SRAM) in a configurable IC. However, the same techniques can easily be applied for other types of memory and electronic circuits. In other instances, well-known structures and devices are shown in block diagram form in order not to obscure the description of the invention with unnecessary detail.

I. Reduced Power Memory Cell

Figure 4:
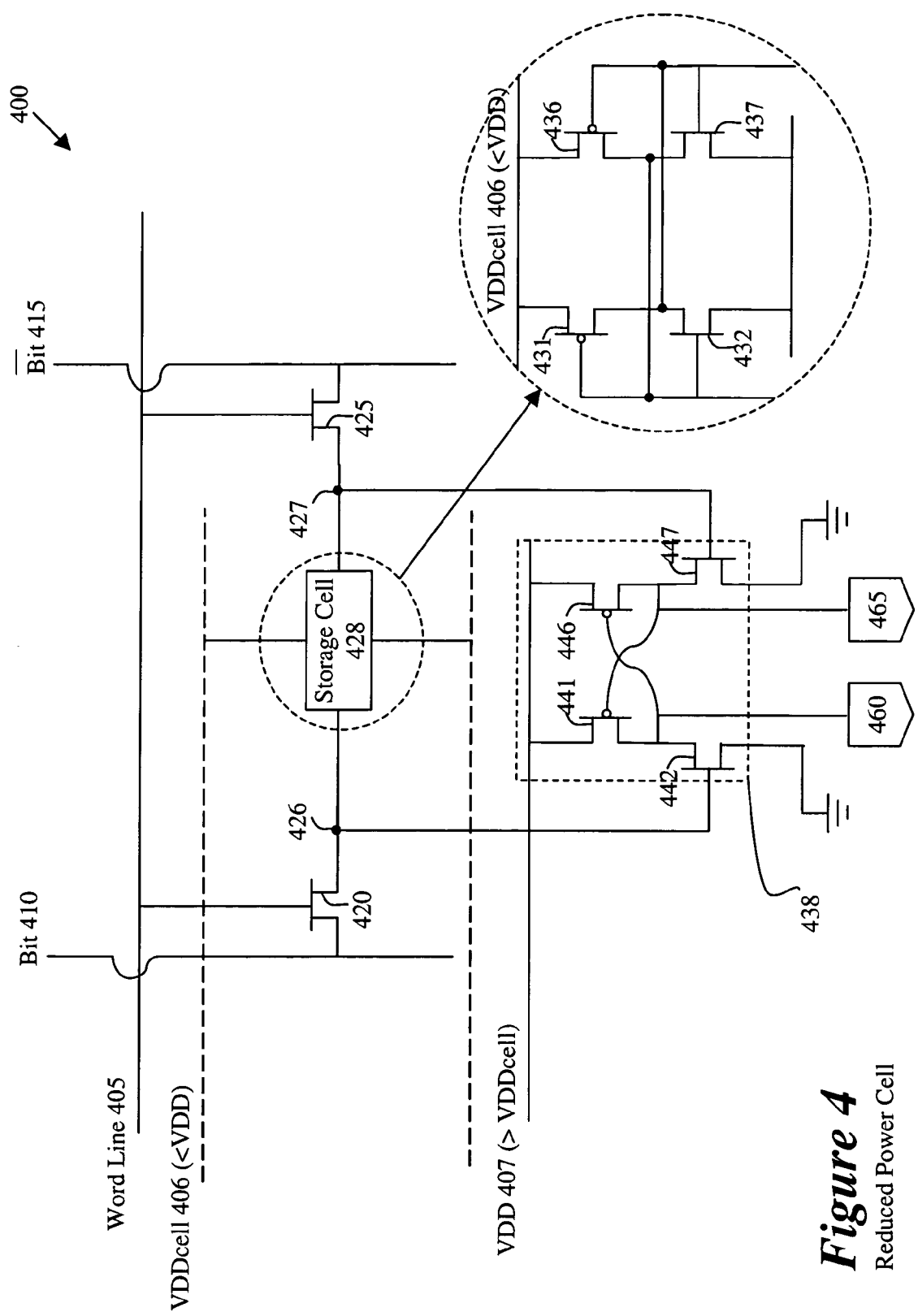
FIG. 4 illustrates a diagram of a memory circuit comprising a reduced power storage cell according to some embodiments of the invention.

To address the problems of current leakage present in memory cells, some embodiments provide a memory circuit 400 illustrated in FIG. 4 that includes a reduced power storage cell 428. During normal operation, the reduced power storage cell 428 is supplied with a lower voltage so that it will leak less current, and therefore consume less power than the storage cells known in the art. Moreover, the reduced power storage cell 428 outputs through an amplifier circuit 438, which also leaks less current than the buffers in the art.

As shown in FIG. 4, the memory circuit 400 includes a word line 405, a VDDcell line 406, a bit line 410, a complement bit line 415, pass gates 420 and 425, a reduced power storage cell 428, and an amplifier stage 438. In some embodiments, the pass gates 420 and 425 are NMOS transistors that connect the bit line 410 and the complement bit line 415 to the storage cell 428 when the signal on the word line 405 is high.

The pass gates 420 and 425 enable writes to, and reads from, the storage cell 428. During a read operation, the value in the storage cell 428 is "read" out onto the bit line 410 and the complement bit line 415 (hereinafter also referred to as the bit lines). Specifically, for the read operation of some embodiments, the voltages stored at the nodes 426 and 427 pass through the pass gates 420 and 425 to affect the voltages on the bit lines 410 and 415. In some embodiments, the bit lines 410 and 415 are precharged and then allowed to float high in anticipation of a read operation. Also during a read operation, a sense amplifier (not shown in FIG. 4) monitors the bit lines 410 and 415 to sense or "read" the value stored in the storage cell 428 through the bit lines 410 and 415.

During a write operation, the values on the bit lines 410 and 415 are "written" into the storage cell 428. Specifically, for the write operation of some embodiments, voltages on the bit lines 410 and 415 pass through the pass gates 420 and 425 to alter the voltages stored at the nodes 426 and 427. As shown in FIG. 4, some memory cells require a true configuration signal and its complement signal (provided by the bit lines 410 and 415) for the memory circuit 400 to execute reliable read and write operations. In these embodiments, the bit lines 410 and 415 are precharged, then one is pulled low to effect differential signals for the write operation.

FIG. 4 illustrates that the reduced power storage cell 428 of some embodiments is formed by cross coupling a pair of standard complementary metal oxide semiconductor (CMOS) inverters. These CMOS inverters are cross-coupled in that the output of the first inverter is coupled to the input of the second inverter and the output of the second inverter is coupled to the input of the first inverter.

The cut-out in FIG. 4 illustrates the cross coupled transistors of two standard CMOS inverters. This cut-out includes PMOS transistors 431 and 436 and NMOS transistors 432 and 437. To form a first inverter, the drains of the transistors 431 and 432 are connected, and the gates of these transistors are also connected. To form a second inverter, the drains of the transistors 436 and 437 are connected, and the gates of these transistors are also connected. Cross-coupling of the two inverters is achieved by connecting the drains of the first inverter's transistors to the gates of the second inverter's transistors, and by connecting the drains of the second inverter's transistors to the gates of the first inverter's transistors. The sources of the transistors 432 and 437 are connected to ground.

The source leads of the PMOS transistors 431 and 436 are connected to the VDDcell line 406. When the VDDcell line 406 supplies power to the storage cell 428, a value that represents a bit can be stored at the output (the transistor drains) of the first inverter (i.e., at node 426) and a value that represents the complement of the bit can be stored at the output (the transistor drains) of the second inverter (i.e., at node 427). In certain conditions (i.e., during the normal operation of the cell 428), the VDDcell line 406 supplies reduced power by using a reduced voltage. Thus, the storage cell 428 stores reduced voltages at the nodes 426 and 427 to represent the stored bit and its complement.

When operating based on a reduced voltage (e.g., VDDcell less than VDD), the storage cell 428 consumes less power, since the power consumed by a circuit is non linearly proportional to the voltage within the circuit. In some embodiments, the voltage supplied by the VDDcell line 406 is less than the voltage provided by the VDD line 407 by one NMOS threshold. In other embodiments, the voltage from the VDDcell line 406 is less than the voltage from the VDD line 407 by more than one NMOS threshold. At the reduced voltage, the current leakage from the electronic components of the storage cell 428 is exponentially lower at the lower voltage.

As mentioned above, the storage cell 428 normally provides continuous output of its stored value. While the storage cell 428 stores values at a voltage less than VDD, a typical useable configuration output has a voltage approximately equal to the full supply voltage VDD. Some embodiments compensate for the reduced voltage within the cell 428 by replacing the pair of configuration buffers 140 and 145 shown in FIG. 1, with the amplifier stage 438 of FIG. 4. In these embodiments, though reduced voltage is supplied to the storage cell 428, the storage cell 428 outputs the value representing the stored bit through the amplifier stage 438 at the full supply voltage (VDD). Moreover, the amplifier stage 438 buffers the storage cell 428 from the configuration outputs 460 and 465, to prevent an undesirable change in the stored data when these outputs 460 and 465 are accessed by external circuitry (not shown).

As shown in FIG. 4, the amplifier stage 438 can be implemented by using the PMOS transistors 441 and 446, and the NMOS transistors 442 and 447. In these embodiments, the sources of the PMOS transistors 441 and 446 are coupled to the VDD line 407 (VDD≧VDDcell). The PMOS transistors 441 and 446 are cross-coupled, meaning that the gate of the PMOS 441 is coupled to the drain of the PMOS 446, and the gate of the PMOS 446 is coupled to the drain of the PMOS 441. As further shown in FIG. 4, the drain of the PMOS 441 is coupled to the drain of the NMOS 442 and the drain of the PMOS 446 is coupled to the drain of the NMOS 447. The sources of the NMOS transistors 442 and 447 are grounded.

Also shown in FIG. 4, the gate of the NMOS transistor 442 is coupled to the storage cell 428 and the pass gate 420 at the node 426. Similarly, the gate of the NMOS transistor 447 is coupled to the storage cell 428 and the pass gate 425 at the node 427.

In some embodiments, the four transistors 441, 442, 446 and 447 described above form the amplifier stage 438 by implementing a static level converter. In these embodiments, the level converter does not directly drive the PMOS transistors 441 and 446. Rather, the cross-coupled PMOS transistors 441 and 446 provide differential level conversion. Thus, the voltage VDD supplied by the VDD line 407 from the level converter (the four transistors) of the amplifier stage 438 drives the configuration outputs 460 and 465, instead of the reduced voltage from the VDDcell line 406.

The advantage of the level converter is that the voltage swing on the NMOS transistors 442 and 447 from the storage cell 428 is not required to go all the way to the rails (all the way to the full supply voltage VDD) for the value in the storage cell 428 to be correctly outputted. This allows the storage cell 428 to operate at reduced voltages. The reduced operating voltage reduces both the sub threshold leakage and the gate leakage of the cell 428. The storage cell 428 in the memory circuit 400 consumes less power at the reduced voltage (supplied by the VDDcell line 406). Despite operating at the reduced voltage, the cell 428 properly outputs its configuration value.

Figure 1:
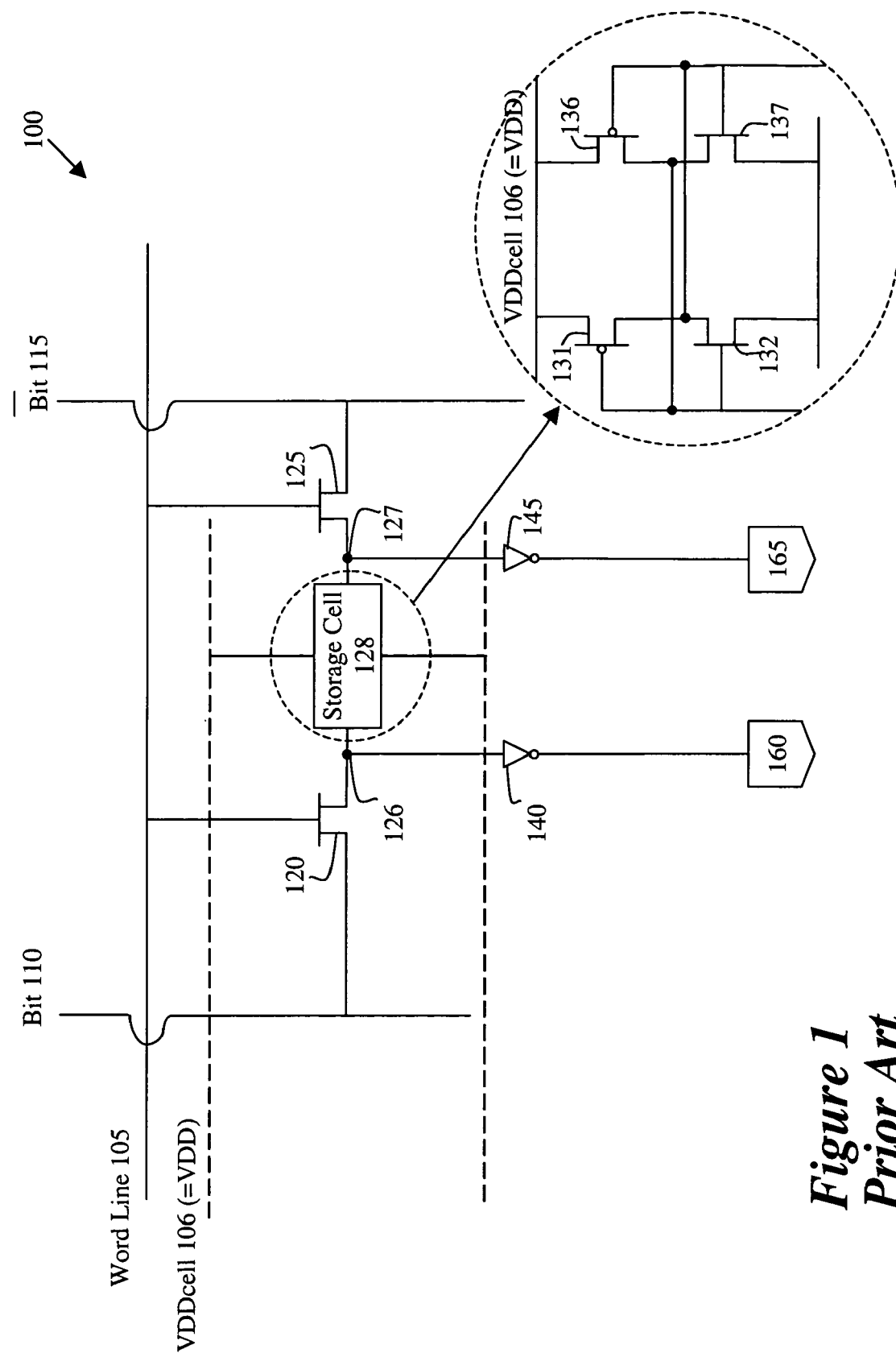
FIG. 1 illustrates a diagram of a typical memory circuit as is known in the art.

Moreover, since the supply voltage VDD (from VDD line 407) passes only through the PMOS transistors 441 and 446 before reaching the outputs 460 and 465, the amplifier stage 438 leaks significantly less current than the configuration buffers 140 and 145 of the prior art memory cell 100 illustrated in FIG. 1. This is partly because the configuration buffers 140 and 145 are typically implemented with a greater number of transistors, each of which leaks current, and partly because these transistors include NMOS transistors, each of which leaks more current than PMOS transistors.

II. Operation and Control of the Reduced Power Cell

Figure 5:
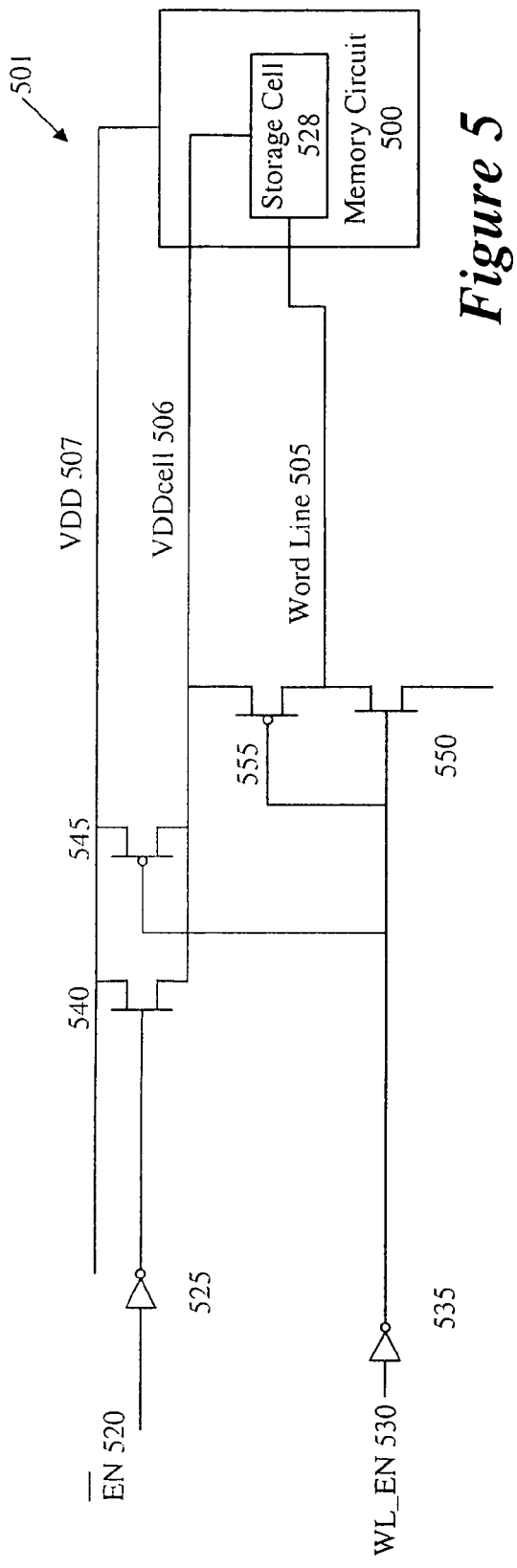
FIG. 5 illustrates a control circuit for a memory circuit comprising a reduced power storage cell according to some embodiments of the invention.
Figure 3:
FIG. 3 illustrates gate leakage through an NMOS transistor and sub threshold leakage through a PMOS transistor.
Figure 2:
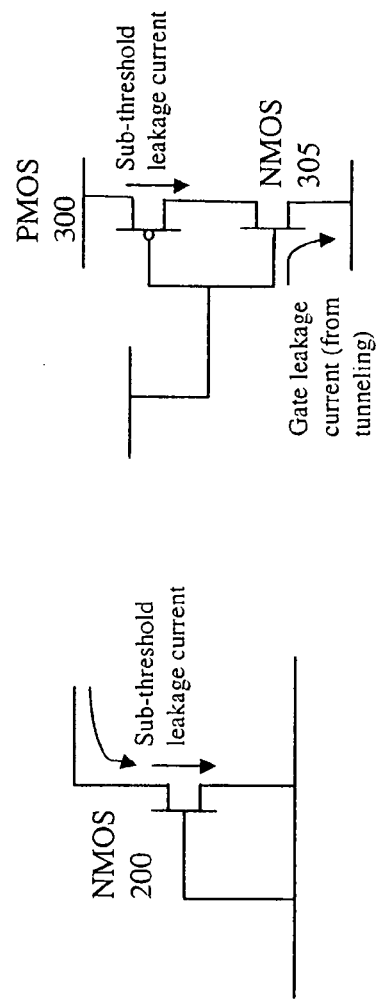
FIG. 2 illustrates sub threshold leakage through an NMOS transistor.

The operation of the reduced power storage cell 428 will now be described in relation to FIGS. 4 and 5. As previously described, FIG. 4 illustrates a memory circuit 400 that includes the reduced power cell 428. FIG. 5 illustrates a control circuit 501 that provides control signals for the memory circuit 400. The memory circuit 400 is represented in FIG. 5 as the simplified memory circuit 500.

More specifically, FIG. 5 illustrates the control circuit 501 having two control inputs, Not_Enable (EN-bar 520) and Word_Line_Enable (WL_EN 530), that provide three states: 1) Disabled; 2) Read/Write; and 3) Normal states for the memory circuit 500. The input Not_Enable 520 is coupled to the input of the inverter 525. The output of the inverter 525 is coupled to the NMOS transistor 540. The NMOS transistor 540 connects the VDD line 507 to the VDDcell line 506. The input Word_Line_Enable 530 is coupled to the input of the inverter 535. An output of the inverter 535 is coupled to the transistors 545, 550, and 555.

As further shown in FIG. 5, the PMOS transistor 545 connects the VDD line 507 to the VDDcell line 506. The PMOS transistor 555 connects the VDDcell line 506 to the word line 505. The PMOS transistor 545 is "stacked" above the PMOS transistor 555 such that the voltage on the word line 505 may never exceed the voltage on the VDDcell line 506. Likewise, the voltage on the VDDcell line 506 may never exceed the voltage on the VDD line 507. Since these voltages are tiered or "stacked" above and below the PMOS transistors 545 and 555 (i.e., the voltage on the VDD line 507≧VDDcell line 506≧word line 505), a read operation will not upset a value stored in the storage cell 528. In other words, because the voltage on the word line 505 may equal, but may never exceed, the voltage on the VDDcell line 506, a "read upset" condition is avoided by the control circuit 501.

The three states for the memory circuit 500 will now be described by reference to the control circuit 501. As previously discussed, the three states for the memory circuit 500 include a Disabled State, a Read/Write State, and a Normal State.

1. Disabled State (EN-bar=1, WL_EN=0)

When the input signal at the input Not_Enable 520 has a logical "1" and the signal at the input Word_Line_Enable 530 has a logical "0," both the NMOS 540 and the PMOS 545 transistors are turned off and no power is supplied to the VDDcell line 506. Thus, no power is supplied to the storage cell 528 that is coupled to the VDDcell line 506. In this Disabled State, the memory circuit 500 that is controlled by the control circuit 501 is not used at all in the current arrangement.

As is more specifically shown by reference to FIG. 4, during the Disabled State, the word line 405 and the VDDcell line 406 have a logical "0." When the VDDcell line 406 has a logical "0," no power is provided to the storage cell 428. Further, since the storage cell 428 outputs no value to the NMOS transistors 442 and 447, the output of the amplifier stage 438 floats (e.g., at one P-channel threshold below the rail). Thus, the memory circuit 400 stores and outputs no value in the Disabled State.

The Disabled State is useful, for example, in the case of a configurable circuit where it is desirable to power off parts of the circuit (e.g., an array or parts of an array of memory cells). Powering off cells in this manner can additionally conserve power.

2. Read/Write State (EN-bar=0, WL_EN=1)

For the Read/Write State, the control circuit 501: (1) provides the full supply voltage VDD to the storage cell 528, so that it can store and output a value, and so that the memory circuit 500 can access the cell 528 through a read/write operation; (2) enables the word line 505 to select the cell 528 for the read/write operation; and (3) prevents the voltage on the word line 505 from exceeding the voltage on the VDDcell line 506, such that a read upset condition is avoided.

More specifically, when an input signal at the input Not_Enable 520 has a logical "0" and the input Word_Line_Enable 530 has a logical "1," then current flows from the VDD line 507 through the VDDcell line 506 (via the PMOS transistor 545), and from the VDDcell line 506 through the word line 505 (via the PMOS transistor 555). In other words, the PMOS transistors 545 and 555 switch to low impedance which pulls the voltages on these lines (VDD cell line 506 and word line 505) up to the level of approximately VDD. In this state, the memory circuit 500 performs a read and/or write operation by using the full supply voltage VDD, in the manner of a typical memory cell in the art.

As more specifically shown in FIG. 4, during a read or a write operation, both the VDDcell line 406 and the word line 405 are activated (have a logical "1"). As previously described, the VDDcell line 406 provides a voltage at approximately VDD to the storage cell 428 to allow for a typical read or write operation by using the full supply voltage VDD. Since the word line 405 is activated, the pass gates 420 and 425 are turned on, and voltage signals are allowed to pass between the bit lines 410 and 415, and the storage cell 428. During a write operation, the voltage signals on the bit lines 410 and 415 modify the voltages (which represent the stored value) at the nodes 426 and 427. For instance, the value on the bit line 410 passes through the pass gate 420 and is stored in the storage cell 428 at node 426 during a write operation. Conversely, the value stored in the storage cell 428 at node 426 passes through the pass gate 420 to modify the voltage on the bit line 410, during a read operation. Write and read operations occur in the same manner through the pass gate 425 between the node 427 and the complement bit line 415 in the Read/Write State. Moreover, the nodes 426 and 427 (representing the stored bit and its complement) each may have a value approximately equal to VDD that is applied to the amplifier stage 438. As previously mentioned, the amplifier stage 438 produces an output with a voltage of approximately VDD.

Specifically, as shown in FIG. 4, the storage cell 428 is coupled to the amplifier stage 438 at the gate-inputs of the NMOS transistors 442 and 447. Thus, if a logical "1" is at the node 426, then the NMOS transistor 442 will be activated and the PMOS transistor 446 will also be activated. Accordingly, current will flow from the VDD line 407 through the PMOS transistor 446 to the configuration output 465. Conversely, the cross-coupled PMOS transistor 441 will ensure that the output 460 will be pulled low (i.e., grounded through the NMOS transistor 442.

As previously mentioned, the amplifier stage 438 leaks less current than its counterpart in the prior art (buffers 140 and 145) because the output voltage only passes through a low impedance PMOS transistor. However, the Normal State has even lower current leakage.

3. Normal State (EN-bar=0, WL_EN=0)

As shown in FIG. 5, when the input signal at the input Not_Enable 520 has a logical "0" and the signal at the input Word_Line_Enable 530 has a logical "0," the NMOS transistor 540 is turned on and current flows from the VDD line 507 through the VDDcell line 506. Because the signal at the output of the inverter 535 is a logical "1," both the PMOS transistors 545 and 555 are turned off and the word line 505 has a logical "0." When the PMOS transistors 545 and 555 are off, the word line 505 is not enabled for reading or writing the contents of the storage cell 528 in the memory circuit 500. Moreover, because the NMOS transistor 540 connects the VDDcell line 506 to the VDD line 507, the VDDcell line 506 has a reduced voltage of approximately one NMOS threshold below the full supply voltage VDD.

Therefore, the memory circuit 500 is used in the current arrangement (of a configurable IC, for instance) but the memory circuit 500 is not currently being accessed by a read or write operation through the word line 505. However, the memory circuit 500 is outputting a value stored in the storage cell 528 to the configuration outputs 560 and 565. This is the normal active state of the memory circuit 500.

As more specifically shown in FIG. 4, during the Normal State, the VDDcell line 406 is activated but the word line 405 is de-activated. Since the word line 405 is de-activated, the pass gates 420 and 425 are turned off. When the pass gates 420 and 425 are turned off, the bit lines 410 and 415 are not used to write to, and are not used to read from, the storage cell 428. However, since the VDDcell line 406 is activated, (a reduced) power is supplied to the storage cell 428 to maintain a value stored in the storage cell 428. Since the cell operates at the reduced voltage (which in some embodiments is less than VDD by an NMOS threshold), the electronic components of the cell 428 leak exponentially less current than the prior art cell. Further, the value stored in the storage cell 428 is applied to the amplifier stage 438 through the NMOS transistors 442 and 447.

Accordingly, the amplifier stage 438 outputs the value stored in the storage cell 428 at a voltage approximately equal to VDD (from the VDD line 407). As mentioned above, the voltage signal from the VDD line 407 through the PMOS transistors 441 and 446 to the configuration outputs 460 and 465 is roughly equal to the full supply voltage VDD. In this manner, the voltage signal from the storage cell 428 that is approximately equal to VDDcell is amplified (level-converted) for output at the amplifier stage 438 to a value that is approximately equal to VDD. As previously mentioned, the voltage on the VDDcell line 406 can be less than the voltage on the VDD line 407 by one or more NMOS thresholds because the NMOS transistors 442 and 447 of the amplifier stage 438 do not require full swing. Thus, the amplifier stage 438 converts (amplifies) the voltage level from the storage cell 428 before outputting the voltage signal at the configuration outputs 460 and 465. Therefore, in the Normal State, the storage cell 428 can operate at a reduced voltage to minimize leakage while maintaining and outputting a stable configuration output value at approximately the full supply voltage VDD.

4. Table Showing Inputs, Outputs, and States

Table 1 summarizes the three states for the memory circuit 500 in relation to the input values for the control circuit 501. Table 1 also shows the values of the VDDcell line 506 and the word line 505 for the three states according to one embodiment of the present invention. For instance, the VDDcell line 506 is approximately equal to VDD (the full supply voltage) which allows typical reading and/or writing operations during the Read/Write State. During the Read/Write State the word line 505 is also approximately equal to VDD. During the Normal State, however, the word line 505 is de-activated and the VDDcell line 506 is about one NMOS threshold below VDD. As described above, reducing the VDDcell voltage by only one NMOS threshold is sufficient to result in a significant reduction in current leakage.

III. Performance and Advantages

As mentioned in relation to FIG. 4, the voltage within the cell (VDDcell) can be reduced from about 1.0V to about 0.8V or approximately one NMOS threshold, in some embodiments. In other embodiments VDDcell may be reduced by a plurality of NMOS thresholds to further reduce current leakage through the electronic components (e.g., the MOS transistors) of the memory circuit storage cell.

Some embodiments use 90 nm electronic components. At 90 nm the sub threshold leakage and the gate leakage are roughly equal. Since gate leakage is more sensitive to voltage reductions, some embodiments provide greater reduction in the gate leakage for 90 nm components. For 65 nm components, gate leakage is often worse than sub threshold leakage. Thus, a greater improvement in overall leakage reduction may occur for electronic components using 65 nm technologies.

Some embodiments allow the reduced voltage to be used for a set of cells that are similar to the cell 428 in FIG. 4, to reduce the power consumed and leaked by the entire set of memory cells. For instance, the invention also allows an entire row of cells to be powered down at a time. This feature can be useful, for instance, in an FPGA where the whole array may not be needed for some arrangements of the FPGA. Thus, the present invention allows for additional power savings by allowing unused parts of the array to be powered off. The invention has been described in relation to FPGA's and configuration cells. However, one of ordinary skill in the art will recognize that the invention would be useful in a variety of memory and other applications where reduced power consumption and lower leakage are desirable.

The foregoing has described a reduced power cell. One of ordinary skill will also recognize that the invention can be embodied in other specific forms without departing from the spirit of the invention, even though the invention has been described with reference to numerous specific details. In view of the foregoing, one of ordinary skill in the art would understand that the invention is not to be limited by the foregoing illustrative details, but rather is to be defined by the appended claims.

TABLE 1

| State | EN-bar 520 | WL EN 530 | VDDcell 406 | Word Line 405 |
|---|---|---|---|---|
| Disabled | 1 | 0 | 0 | 0 |
| Read/Write | 0 | 1 | (VDD) | (VDD) |
| Normal | 0 | 0 | (VDD-1Vth) | 0 |

What is claimed is:

1. A memory circuit that is part of an integrated circuit that operates at standard power-supply voltage levels, the memory circuit comprising:
   a storage cell;
   said storage cell having a plurality of electronic components;
   said storage cell receiving a reduced power-supply voltage and storing data at a reduced operating voltage during the operation of the memory circuit,
   a level converter attached to said storage cell, wherein said level converter: (1) receives said reduced operating voltage stored in the storage cell, and (2) level converts said reduced operating voltage into a standard voltage level so that the data stored in the storage cell is supplied to another device in the integrated circuit at the standard voltage level;
   wherein said reduced operating voltage reduces the current leakage of said electronic components within said cell.

2. The memory circuit of claim 1, wherein the data stored in the storage cell is configuration data, the memory circuit further comprising an output line coupled to said storage cell, said output line for providing the data stored in said cell.

3. The memory circuit of claim 2, wherein said data stored in said cell is provided continuously along said output line.

4. The memory circuit of claim 3, wherein the data stored in the storage cell is level converted to a standard power-supply voltage level of another circuit that contains the memory circuit, before being supplied to the output line.

5. The memory circuit of claim 1, said memory circuit for use by a configurable circuit.

6. The memory circuit of claim 1, wherein said storage cell comprises a pair of cross coupled CMOS inverters.

7. The memory circuit of claim 1, wherein said level converter comprises a pair of cross coupled PMOS transistors.

8. A method of storing data in a memory circuit that is part of an integrated circuit that operates at standard power-supply voltage levels, the memory circuit comprising a storage cell, said cell comprising a plurality of electronic components, said method comprising:
   supplying the storage cell with a reduced power-supply voltage;
   storing data in the storage cell at a reduced operating voltage;
   receiving the data at the reduced operating voltage into a level converter; and
   level converting said reduced operating voltage into a standard voltage level that is supplied to another device in the integrated circuit;
   wherein said reduced operating voltage reduces the current leakage of electronic components within said cell.

9. The method of claim 8, wherein the data is configuration data.

10. The method of claim 9, wherein the other device is a configurable circuit, the method further comprising outputting the data stored in the storage cell to the configurable circuit.

11. The method of claim 8, wherein the storage cell comprises a cross-coupled pair of inverters.

12. The memory circuit of claim 1, further comprising:
   a first control circuit coupled to the storage cell;
   the first control circuit for receiving a standard operating voltage, reducing the standard operating voltage into the reduced operating supply voltage, and supplying the reduced operating supply voltage to the storage cell.

13. The memory circuit of claim 12, wherein the first control circuit reduces the standard operating voltage to the storage cell when the storage cell is storing data.

14. The memory circuit of claim 12 further comprising a second control circuit for supplying the standard operating voltage to the storage cell during read or write access to the storage cell.

15. The memory circuit of claim 12, wherein the standard operating voltage is reduced by a threshold.

16. A configurable integrated circuit operating at a standard operating voltage, the configurable integrated circuit comprising:
   a configurable circuit for configurably performing a set of operations;
   a memory circuit comprising a storage cell with electronic components;
   said storage cell for storing configuration data at reduced operating voltage in order to reduce leakage current through the electronic components during the operation of the memory circuit;
   said memory circuit for outputting configuration data at the standard operating voltage to the configurable circuit;

a level converter attached to said storage cell, wherein said level converter:
  (1) receives said reduced operating voltage stored in the storage cell; and
  (2) level converts said reduced operating voltage into the standard operating voltage to supply the data stored in the storage cell to the configurable circuit.

17. The configurable integrated circuit of claim 16, wherein said level converter comprises a pair of cross coupled PMOS transistors.

18. The configurable integrated circuit of claim 16, wherein said storage cell comprises a pair of cross coupled CMOS inverters.

* * * * *